United States Patent
Imanaka et al.

(10) Patent No.: US 6,474,562 B2
(45) Date of Patent: Nov. 5, 2002

(54) GAS INJECTOR AND GAS INJECTION DIRECTION ADJUSTING METHOD

(75) Inventors: Yasuo Imanaka, Ikoma-gun (JP); Hiromitsu Harada, Kashihara (JP); Mitsuhiro Fujita, Soraku-gun (JP); Yukio Miyaki, Kyotanabe (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/752,681

(22) Filed: Jan. 3, 2001

(65) Prior Publication Data

US 2001/0020651 A1 Sep. 13, 2001

(30) Foreign Application Priority Data

Mar. 10, 2000 (JP) ......................................... 2000-067595

(51) Int. Cl.[7] .......................... B05B 17/00; B05B 15/08
(52) U.S. Cl. ................... 239/1; 239/587.1; 239/587.2; 239/587.3
(58) Field of Search .................. 239/1, 587.1, 587.2, 239/587.4, 580, 589, 569, 581.1, 581.2, 582.1, 587.3; 251/149.2, 149.6, 149.9; 137/615, 616

(56) References Cited

U.S. PATENT DOCUMENTS

| | | | | |
|---|---|---|---|---|
| 1,758,115 A | * | 5/1930 | Kelly ....................... 239/587.3 |
| 2,971,701 A | * | 2/1961 | Shames et al. ........... 239/587.3 |
| 3,012,733 A | * | 12/1961 | Allenbaugh, Jr. ......... 239/581.2 |
| 4,128,209 A | * | 12/1978 | Johnson .................... 239/583 |
| 4,248,385 A | * | 2/1981 | Hickerson ................ 239/581.2 |
| 4,360,160 A | * | 11/1982 | Jette ........................ 239/587.3 |

\* cited by examiner

*Primary Examiner*—Henry C. Yuen
*Assistant Examiner*—Davis Hwu
(74) *Attorney, Agent, or Firm*—Nixon & Vanderhye P.C.

(57) ABSTRACT

There is provided a nozzle section having a nozzle for injecting gas and a spherical portion composed of a nozzle nut part and a spherical base end portion, respectively on its front end portion and base end portion. There is provided a nozzle case for supporting the spherical portion so as to make an outward gas injection direction of the nozzle adjustable. The spherical base end portion and the nozzle nut part are provided so that they are separated from one another by the rotation of one of the nozzle and nozzle nut part about the axis of the longitudinal direction. The nozzle section which has been adjusted to have a gas injection direction is fixed from the side of the nozzle, thereby simplifying adjustment of a gas injection direction at the nozzle section by eliminating conventionally required additional operations.

24 Claims, 10 Drawing Sheets

GAS INJECTOR AND GAS INJECTION DIRECTION ADJUSTING METHOD

FIELD OF THE INVENTION

The present invention relates to a gas injector having a gas injection nozzle for forming a reactive deposition film, which is used in manufacture of semiconductor circuit substrates such as ICs and LSIs, and to a gas injection direction adjusting method using such a gas injector.

BACKGROUND OF THE INVENTION

Conventionally known is a semiconductor manufacturing device having the structure as shown in FIG. 13 for forming a reactive deposition film on wafers 51 as semiconductor substrates. The semiconductor manufacturing device as shown in FIG. 13 includes a quartz bell jar 52 of a hollow vessel, a susceptor 53, and a pair of reaction gas injection nozzles 54. The susceptor 53 is a wafer holder in the form of a polygonal pillar which is detachably stored in and coaxial with the quartz bell jar 52.

The reaction gas injection nozzles 54 are provided on the upper portion of the quartz bell jar 52. The reaction gas injection nozzles 54 are provided to inject reaction gas, for example, such as hydrogen gas or silan gas while controlling pressure (e.g., at 25 PSI (pounds per square inch)) and flow rate. The injected reaction gas circulates inside the quartz bell jar 52 to allow a reactive deposition film to grow on the surface of the wafers 51 and flows towards a vent 52a provided on the lower portion of the quartz bell jar 52. The susceptor 53 is arranged to also rotate about the axis. This allows the reactive deposition film to have an even thickness with respect to the wafers 51 held on the susceptor 53.

In the semiconductor manufacturing device having the foregoing arrangement, in the event where jet flows of the reaction gas injected from the pair of reaction gas injection nozzles 54 are not aligned in direction or angle, the density of the gas flows inside the quartz bell jar 52 will not be uniform, and the reactive deposition film formed on the wafers 51 comes to have uneven film thickness. In order to solve this problem, the direction or angle of the reaction gas injection nozzles 54 needs to be adjusted.

The following explains how the reaction gas injection nozzles 54 were fastened and adjusted conventionally based on FIG. 14(a) through FIG. 14(c).

First, the fastening procedure will be explained referring to FIG. 14(a). A nozzle case 61 is fixed on a fastening screw 52c formed on each inner wall of a pair of gas supply openings 52b which are provided on the upper portion of the quartz bell jar 52. To the nozzle case 61 are attached a nozzle 62 and a nozzle retainer 64. The nozzle 62 is temporarily fixed in place with a nozzle fixing screw 64a.

Here, a spherical portion 62a at the rear end of the nozzle 62 is held between a ring-shaped front end of the nozzle case 61 and the front end of the nozzle retainer 64 and is slidable. This allows the front end of the nozzle 62 to be adjusted at any angle in the horizontal and vertical directions by the sliding spherical portion 62a.

The following describes how the injection angle is adjusted in the reaction gas injection nozzle 54. First, as shown in FIG. 13, a direction indicator board 65 is placed at a predetermined position in the injection direction of the reaction gas at the upper portion of the quartz bell jar 52. Then, a nozzle direction indicator rod 66 (FIG. 14(b)) is inserted into a gas injection opening 62b of the nozzle 62 (FIG. 14(a)). Thereafter, the tip of the nozzle direction indicator rod 66 is adjusted to point 0 (target direction) on the center of the direction indicator board 65 by changing the direction of the nozzle 62. The nozzle fixing screw 64a is then tightened from the side of a gas supply joint section 68 on the side of the base end to fix the adjusted direction or angle of the nozzle 62.

Here, the spherical portion 62a of the nozzle 62 is fixed by the front end of the nozzle case 61 and the front end of the nozzle retainer 64 by the pressure of the screwed nozzle fixing screw 64a. As a result, the spherical portion 62a becomes unslidable. Thereafter, the nozzle direction indicator rod 66 is removed from the nozzle 62, and the direction indicator board 65 is removed from the quartz bell jar 52.

Then, as shown in FIG. 14(c), the gas supply joint section 68 is connected to the nozzle case 61 so as to seal the quartz bell jar 52. Afterwards, the connected portion of the nozzle case 61 and the gas supply joint section 68 is checked for gas leakage while reducing pressure inside the quartz bell jar 52 using a vacuum pump. Then, the gas and wafers 51 are fed to start forming the reactive deposition film on the wafers 51.

However, the foregoing prior art has the problem of low productivity in formation of the reactive deposition film on the wafers 51.

That is, in the foregoing prior art, the nozzle 62 is fixed after adjusting the direction or angle of the nozzle 62 by once loosening the nozzle fixing screw 64a, which necessitates tightening the nozzle fixing screw 64a from the gas supply side.

Therefore, the foregoing prior art required unfastening and fastening of the gas supply joint section 68 before and after adjustment, respectively. That is, there were additional operations of fastening the nozzle 62, attaching or detaching the gas supply joint section 68 to adjust the nozzle direction, and checking for gas leakage at the connected portion of the nozzle case 61 and the gas supply joint section 68. As a result, productivity suffered.

SUMMARY OF THE INVENTION

It is an object of the present invention to provide a gas injector which can improve productivity without requiring the conventionally required additional operations, and to provide an adjusting method thereof.

In order to achieve this object, a gas injector in accordance with the present invention includes: a nozzle main body having on its front end portion a nozzle for injecting gas; and a nozzle main body supporting section for supporting the nozzle main body, wherein the nozzle main body includes first and second members, and displacing means for changing relative positions of the first and second members, and fixed state/unfixed state of the nozzle main body with respect to the nozzle main body supporting section is switched by a change in relative positions of the first and second members by the displacing means, and injection direction of the gas from the nozzle is changed by changing a disposition direction of the nozzle main body in an unfixed state.

In this arrangement, the nozzle main body having the nozzle on its front end portion is supported by the nozzle main body supporting section. Further, the fixed state/unfixed state of the nozzle main body with respect to the nozzle main body supporting section is switched by changing relative positions of the first and second members by the displacing means. By the nozzle main body switched to the unfixed state, the disposition direction of the nozzle main body is changed, thereby changing the gas injection direction.

Thus, the gas injection direction can easily be changed by switching the nozzle main body to the unfixed state, and the adjusted gas injection direction can be fixed by switching the nozzle main body to the fixed state after the adjustment.

Switching of the nozzle main body to the fixed state/unfixed state is carried out by the displacing means of the nozzle main body.

Thus, compared with, for example, the arrangement of the foregoing prior art which requires adjusting the nozzle fixing screw and the like from the gas supply side, the gas injection direction can be adjusted more easily and quickly.

Further, it is possible to omit additional operations, such as checking for gas leakage, which were required when adjusting the nozzle fixing screw and the like from the gas supply side, thus improving productivity.

Further, in order to achieve the foregoing object, a gas injection direction adjusting method in accordance with the present invention is for a gas injector which includes: a nozzle main body having on its front end portion a nozzle for injecting gas; and a nozzle main body supporting section for supporting the nozzle main body, wherein the nozzle main body includes first and second members, and displacing means for changing relative positions of the first and second members, and fixed state/unfixed state of the nozzle main body with respect to the nozzle main body supporting section is switched by a change in relative positions of the first and second members by the displacing means, and the method includes the steps of: inserting an adjusting rod from a gas injection opening of the nozzle so as to adjust a gas injection direction of the nozzle by a tip of the adjusting rod; and fixing the nozzle main body on the nozzle main body supporting section by changing relative positions of the first and second members.

In this method, the gas injection direction is adjusted and set by the tip of the adjusting rod which is inserted in the nozzle to change the disposition direction of the nozzle main body after switching the nozzle main body to the unfixed state. The nozzle main body is fixed after adjustment so as to fix the adjusted gas injection direction.

As a result, the nozzle main body can be fixed on the nozzle main body supporting section by the operation from the nozzle side through, for example, visual confirmation of the tip of the adjusting rod pointing a predetermined direction.

Thus, compared with the conventional fixing by tightening from the gas supply side, conventionally required additional operations can be omitted with the foregoing method. Further, the gas injection direction can be adjusted and set from the nozzle side through confirmation from this side, thus performing fixing securely and quickly.

For a fuller understanding of the nature and advantages of the invention, reference should be made to the ensuing detailed description taken in conjunction with the accompanying drawings.

BRIEF DESCRIPTION OF THE DRAWINGS

FIG. 10($b$) is a front view of a handle section for adjusting the gas injection direction of the nozzle in the gas injector.

FIG. 14($b$) is a front view of a nozzle direction indicator rod for adjusting the gas injection direction of the nozzle in the gas injector.

FIG. 14($c$) is a cross sectional view of a main portion of a gas supply joint section in the conventional gas injector.

DESCRIPTION OF THE EMBODIMENTS

[First Embodiment]

The following will describe one embodiment of the present invention with reference to FIG. 1 through FIG. 7.

Figure 2:
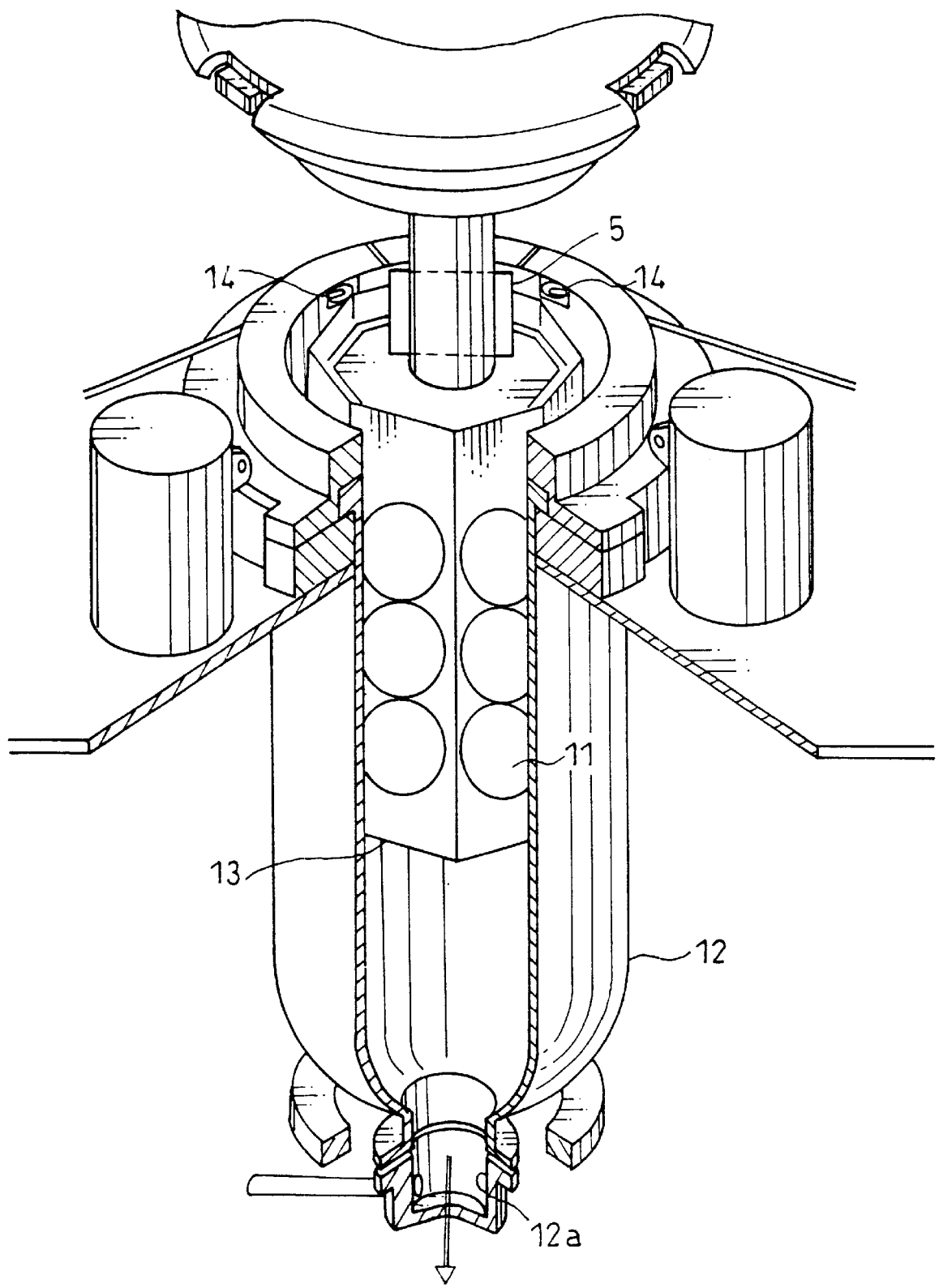
FIG. 2 is a perspective view with a partially broken portion of a semiconductor epitaxial reactor employing the gas injector.

A gas injector in accordance with the First Embodiment of the present invention is suitably used, for example, for a semiconductor epitaxial reactor (semiconductor manufacturing device). The semiconductor epitaxial reactor as shown in FIG. 2 is a device for forming a reactive deposition film on wafers 11 as semiconductor substrates. Also, the semiconductor epitaxial reactor includes a quartz bell jar 12 of a hollow vessel, a susceptor 13, and a pair of reaction gas injection nozzle sections (gas injector) 14. The susceptor 13 is a wafer holder in the form of a polygonal pillar which is detachably stored in and coaxial with the quartz bell jar 12.

The reaction gas injection nozzle sections 14 are provided on the upper portion of the quartz bell jar 12. The reaction gas injection nozzle sections 14 are provided to inject reaction gas, for example, such as hydrogen gas or silan gas while controlling pressure (e.g., at 25 PSI) and flow rate.

The injected reaction gas circulates inside the quartz bell jar 12 to allow a reactive deposition film to grow on the surface of the wafers 11 and flows towards a vent 12$a$ provided on the lower portion of the quartz bell jar 12. The susceptor 13 is arranged to also rotate about the axis. This allows the reactive deposition film to have an even thickness with respect to the wafers 11 held on the susceptor 13.

Figure 3:
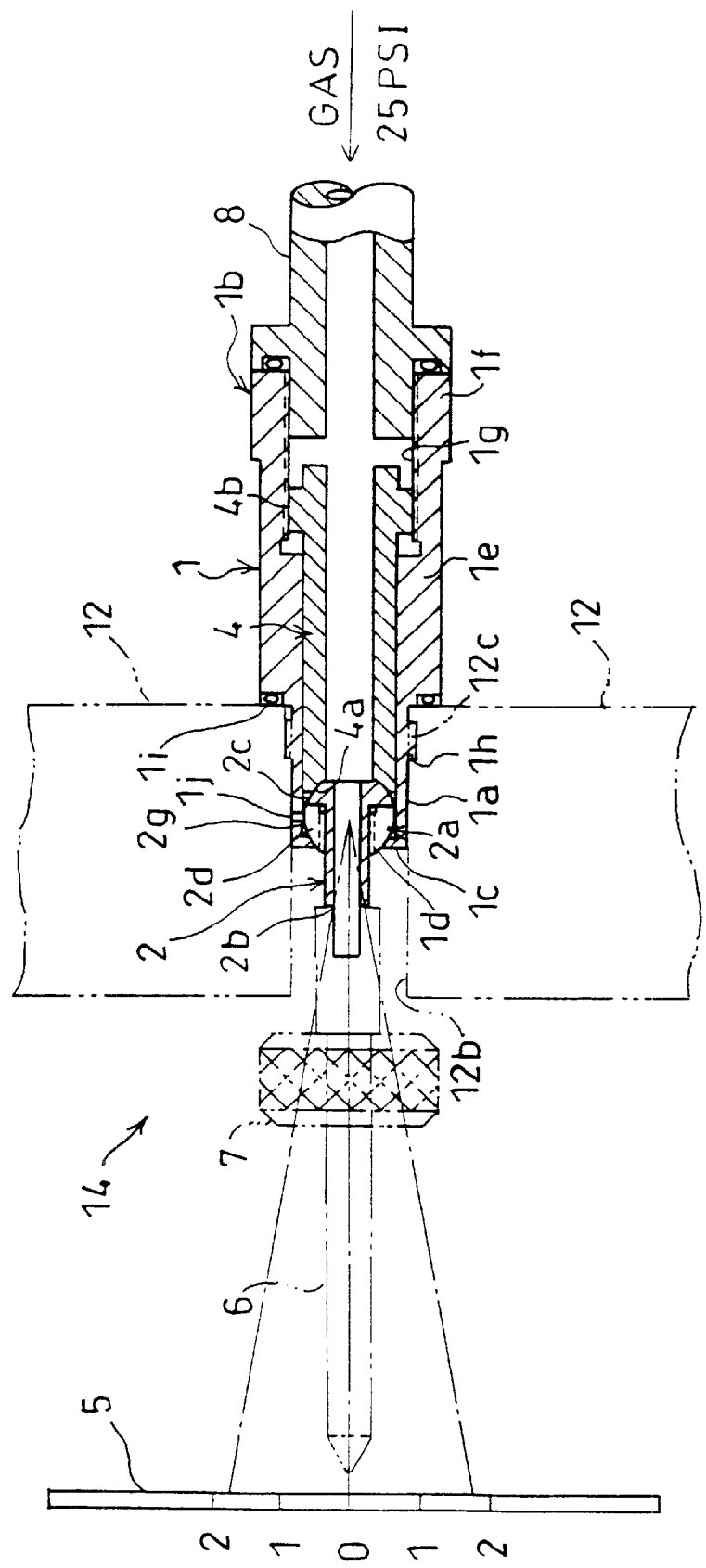
FIG. 3 is a cross sectional view of a main portion of the gas injector, showing how the gas injection direction of the nozzle is adjusted.
Figure 4:
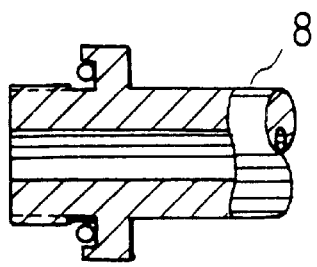
FIG. 4 is a cross sectional view of a main portion of a gas supply joint section of the gas injector.

As shown in FIG. 3, the reaction gas injection nozzle sections 14 have a nozzle case (nozzle main body holder) 1 of a semi-cylindrical shape. The nozzle case 1 is fastened on a gas supply opening 12b with a nozzle case fastening female screw 12c. The gas supply opening 12b of a cylindrical shape is provided through the wall of the quartz bell jar 12. The nozzle case fastening female screw 12c is formed on the inner wall of the cylindrical gas supply opening 12b.

The nozzle case 1 includes a case front end portion 1a of a semi-cylindrical shape and a case base end portion 1b of a semi-cylindrical shape. The case front end portion 1a has the outer diameter substantially the same as or slightly smaller than the inner diameter of the gas supply opening 12b. The case base end portion 1b is continuous from and coaxial with the case front end portion 1a, and has the outer diameter larger than that of the gas supply opening 12b.

The case front end portion 1a is provided to have a flange portion 1c which extends inward in the radial direction to have a circular opening 1d. The case base end portion 1b includes a case main body 1e and a case connecting portion 1f. The case main body 1e is coaxial with and continuous to the case front end portion 1a, and has the inner diameter the same as that of the case front end portion 1a. The case connecting portion 1f is continuous to the case main body 1e, and has the inner diameter larger than that of the case front end portion 1a.

On the internal surface of the case connecting portion 1f surrounding the inner spacing (gas flow path) is formed a nozzle fixing female screw 1g, coaxial with the inner spacing. The nozzle fixing female screw 1g is fitted to a nozzle adjuster 4 (mentioned later) on the front end side. The nozzle fixing female screw 1g is also fitted to a gas supply joint section 8 (FIG. 4) on the base end side. This allows the nozzle case 1 to stably supply gas.

On the external surface of the case front end portion 1a is formed a nozzle fixing male screw 1h to be fitted to the nozzle case fastening screw 12c. On the front end surface of the case base end portion 1b facing the gas supply opening 12b is provided a sealing portion 1i such as an O ring.

Thus, the nozzle case 1 is inserted into the gas supply opening 12b externally from the quartz bell jar 12 and fixed on the gas supply opening 12b by rotating and fitting the nozzle case fastening male screw 1h on the nozzle case fastening female screw 12c while the sealing portion 1i is pressed against the periphery of the gas supply opening 12b. In this manner, the nozzle case 1 is fastened on the quartz bell jar 12 while sealing the quartz bell jar 12.

Further, in the reaction gas injection nozzle sections 14, the nozzle adjuster (nozzle main body supporting section) 4 of a semi-cylindrical shape is inserted through the nozzle case 1. The nozzle adjuster 4 has the outer diameter substantially the same as or slightly smaller than the inner diameter of the case front end portion 1a or case base end portion 1b. Also, the nozzle adjuster 4 is freely movable back and forth in the nozzle case 1 along the central axis direction (longitudinal direction) of the nozzle case 1.

Further, the nozzle adjuster 4 includes, on its front end opening, an opening 4a for supporting a spherical portion (nozzle main body) 2a of a nozzle section 2 (mentioned later), and, around its base end portion, a nozzle fixing male screw 4b to be fitted to the nozzle fixing female screw 1g.

Specifically, the opening 4a may have a concave shape which is curved along and in contact with the surface of the spherical portion 2a, for example, such as a shape of a zone of sphere having substantially the same radius as that of the spherical portion 2a.

Note that, the shape of the opening 4a is not just limited to the concave shape. However, with the concave shape which is curved along and in contact with the surface of the spherical portion 2a (to be described later), it is possible to stably support the nozzle section 2 and securely hold the direction of the nozzle section 2 even when the nozzle section 2 is experiencing vibration as in the case of injecting the reaction gas.

Further, in the reaction gas injection nozzle sections 14, the semi-cylindrical nozzle section 2 is fastened on the case front end portion 1a of the nozzle case 1. The nozzle section 2 is set to have an inner diameter which is smaller than that of the nozzle adjuster 4. This allows the reaction gas which was sent from, for example, the nozzle adjuster 4 to be injected (released) in the form of a jet flow through the opening of a nozzle 2b at the front end portion of the nozzle section 2.

Further, a base end portion of the nozzle 2b of the nozzle section 2 is set to have an outer diameter slightly smaller than the inner diameter of the opening 1d of the case front end portion 1a. The external surface of the nozzle 2b faces the internal surface of the opening 1d.

Further, the spherical portion 2a is formed at the base end portion of the nozzle section 2 so that the center of the spherical portion 2a is on the central axes of the nozzle section 2 and the nozzle adjuster 4 (central axis of gas flow path). Also, the spherical portion 2a is set to have an outer diameter substantially the same as or slightly smaller than the inner diameter of the case front end portion 1a. The spherical portion 2a of the nozzle section 2 is loosely held by the opening 1d of the case front end portion 1a and by the opening 4a of the nozzle adjuster 4. With this arrangement, the gas injection direction from the nozzle section 2 can be freely set in a predetermined range (range of a circular cone). Here, the predetermined range refers to a range which is specified as the external surface of the base end portion of the nozzle 2b comes into contact with the internal surface of the opening 1d.

Figure 5:
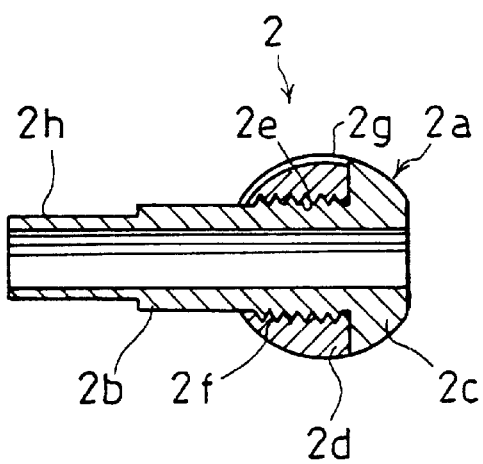
FIG. 5 is a cross sectional view of a nozzle section of the gas injector.

Further, as shown in FIG. 5, the spherical portion 2a includes a spherical base end portion (nozzle base end portion) 2c and a nozzle nut part (nozzle displacing part) 2d. The internal surface of the nozzle nut part 2d has a female screw portion 2e. The external surface of the nozzle 2b of the spherical base end portion 2c has a male screw portion 2f to be fitted to the female screw portion 2e.

Thus, the spherical base end portion 2c and the nozzle nut part 2d are detachable with respect to each other in the longitudinal direction of the nozzle 2b.

Here, the longitudinal direction refers to a direction of the central axis of the cylindrical gas flow path through the nozzle 2b of the nozzle section 2. The cylindrical gas flow path is provided in such a manner that the length along the gas flow direction is longer than the inner diameter of the gas flow path.

As shown in FIG. 3, the spherical base end portion 2c is provided in the form of a flange so as to extend outward in the radial direction at the base end portion of the nozzle section 2. The nozzle nut part 2d is provided so as to be movable back and forth with respect to the spherical base end portion 2c along the longitudinal direction (gas injection direction) of the nozzle section 2.

By the provision of the nozzle nut part 2d, the injection direction of the gas from the nozzle section 2 can be set by the following procedure. First, the nozzle nut part 2d is displaced so that the spherical portion 2a becomes slidable by being loosely held between the opening 1d of the case front end portion 1a and the opening 4a of the nozzle adjuster 4. Then, after setting injection direction of the gas, the nozzle nut part 2d is displaced with respect to the spherical base end portion 2c so that the spherical portion 2a extends in the longitudinal direction. As a result, the pushing force exerted on the spherical portion 2a by the opening 1d and opening 4a is increased, thereby enabling the nozzle section 2 to be fixed in place from the side of the nozzle 2b.

Note that, even though the foregoing described the case where the nozzle nut part 2d is displaced with respect to the spherical based end portion 2c, it is possible alternatively to displace the spherical base end portion 2c with respect to the nozzle nut part 2d, as will be explained later.

As described, the reaction gas injection nozzle sections 14 in accordance with the present invention are arranged such that the direction of the nozzle section 2 can be easily adjusted. Further, unlike the conventional example, it is not required to make adjustment from the side of the gas supply joint section, and the procedure of checking for gas leakage is not required. As a result, direction adjustment of the nozzle section 2 and fastening thereof are made easier and faster. Specifically, for example, the time required for fastening the nozzle section 2 and adjusting the direction of the nozzle section 2 can be reduced to about one-third of the conventional example.

Figure 6:
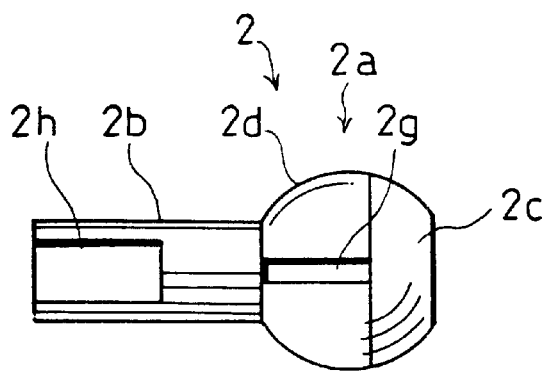
FIG. 6 is a front view of the nozzle section.

In order to make the nozzle nut part 2d freely displaceable with respect to the spherical base end portion 2c along the longitudinal direction, as shown in FIG. 5 and FIG. 6, there is provided a cylindrical inner wall portion having the inner diameter substantially the same as the outer diameter of the nozzle 2b. The inner wall portion has on its internal surface a female screw portion 2e coaxial with the central axis of the nozzle section 2. On the other hand, on the external surface on the base end side of the nozzle 2b of the nozzle section 2 is formed a male screw portion 2f to be fitted to the female screw portion 2e. Note that, instead of the female screw portion 2e and male screw portion 2f, it is possible alternatively to employ a mechanism, for example, such as a cam mechanism, for displacing the relative positions of the nozzle nut part 2d and the spherical base end portion 2c.

Further, on the external surface of the nozzle nut part 2d is formed, as shown in FIG. 6, a rotation preventing groove 2g along the longitudinal direction of the nozzle section 2. This is to avoid rotation of the nozzle nut part 2d following the rotation of the nozzle 2b of the nozzle section 2, or the spherical base end portion 2c integral with the nozzle 2b, when they are rotated.

Meanwhile, as shown in FIG. 3, on the inner wall of the case front end portion 1a is provided a rotation preventing pin 1j orthogonal to the central axis of the nozzle section 2 and projecting inward in the radial direction toward the center of the spherical portion 2a. Note that, the "center of the spherical portion 2a" is meant to indicate the center of the sphere which is formed when the nozzle nut part 2d and the spherical base end portion 2c come into contact with each other at their end surfaces in the longitudinal direction.

The rotation preventing pin 1j is provided by being engaged with the rotation preventing groove 2g so that it is slidable within the rotation preventing groove 2g along the longitudinal direction. By the provision of the rotation preventing groove 2g and rotation preventing pin 1j, the spherical portion 2a has two rotational axes orthogonal to each other.

Further, as shown in FIG. 5 and FIG. 6, on the external surface of the front end portion of the nozzle 2b are formed a pair of nozzle rotating notches 2h with their surfaces being parallel to each other. The nozzle rotating notches 2h are provided to help rotation of the nozzle section 2 about the central axis of the nozzle section 2 from the side of the gas injection opening.

The following describes how the nozzle section 2 is fastened and how the injection direction of the gas from the nozzle section 2 is adjusted by the foregoing mechanism.

As shown in FIG. 2 and FIG. 3, the nozzle case 1 is fastened by fitting it in the gas supply opening 12b of the quartz bell jar 12 of the semiconductor epitaxial reactor. In the nozzle section 2 placed in the nozzle case 1, as shown in FIG. 5 and FIG. 6, the nozzle nut part 2d and the spherical base end portion 2c are in contact with each other on their end surfaces in the longitudinal direction of the nozzle section 2 by being fitted and screwed beforehand, thus forming the spherical portion 2a of a near perfect sphere.

As shown in FIG. 3, the nozzle section 2 having the spherical portion 2a thus assembled is placed in the nozzle case 1. Here, the rotation preventing pin 1j of the nozzle case 1 is engaged with the rotation preventing groove 2g of the nozzle section 2, and the nozzle 2b of the nozzle section 2 project outward from the opening 1d of the nozzle case 1. As a result, the nozzle nut part 2d is fixed on the nozzle case 1 and does not rotate.

Then, the nozzle adjuster 4 is placed in the nozzle case 1 by fitting the nozzle fixing male screw 4b to the nozzle fixing female screw 1g. Also, the spherical portion 2a of the nozzle section 2 is slidably held between the opening 1d of the nozzle case 1 and the opening 4a of the nozzle adjuster 4.

Here, the nozzle 2b of the nozzle section 2 is freely rotatable within a predetermined angle range along the direction of the rotation preventing groove 2g (longitudinal direction). This is because the rotation preventing pin 1j of the nozzle case 1 is engaged with the rotation preventing groove 2g.

Further, the rotation preventing pin 1j is provided orthogonal to the central axis of the nozzle section 2 and projecting inward in the radial direction toward the center of the spherical portion 2a. Therefore, the nozzle 2b is also freely rotatable about the axis of the projecting direction of the rotation preventing pin 1j.

That is, the nozzle 2b of the nozzle section 2 is freely and smoothly rotatable within a range of an imaginary circular cone (in horizontal and vertical directions) where the apex is the center of the spherical portion 2a.

Figure 7:
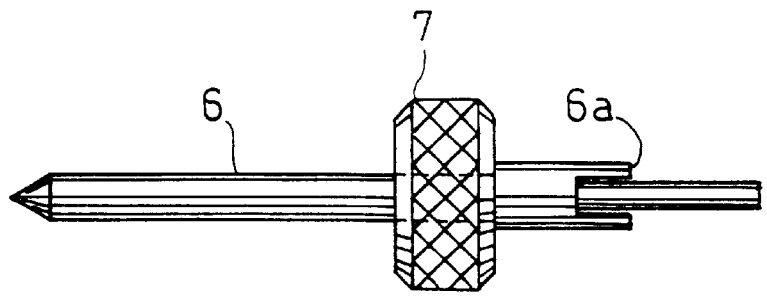
FIG. 7 is a front view of a nozzle direction indicator rod for adjusting the gas injection direction of the nozzle in the gas injector.

The described methods of fastening and adjusting the nozzle section 2 employ the direction indicator board 5 and direction indicator rod 6 as shown in FIG. 3 and FIG. 7 as a guiding tool for indicating the fastening direction of the nozzle section 2. Thus, there is provided a mount (not shown) for fastening the direction indicator board 5, for example as shown in FIG. 2, at a predetermined position at the upper portion of the quartz bell jar 12 of the semiconductor epitaxial reactor.

As shown in FIG. 3, with respect to the nozzle section 2 which was fastened on the nozzle case 1 to be free rotatable, the base end portion of the nozzle direction indicator rod 6 (FIG. 7) is inserted into the nozzle 2b making up the gas ejection opening of the nozzle section 2. Here, raised portions 6a on the inserted portion of the nozzle direction indicator rod 6 are positioned face to face and in contact with the pair of nozzle rotating notches 2h (FIG. 5 and FIG. 6) of the nozzle 2b.

Figure 1:
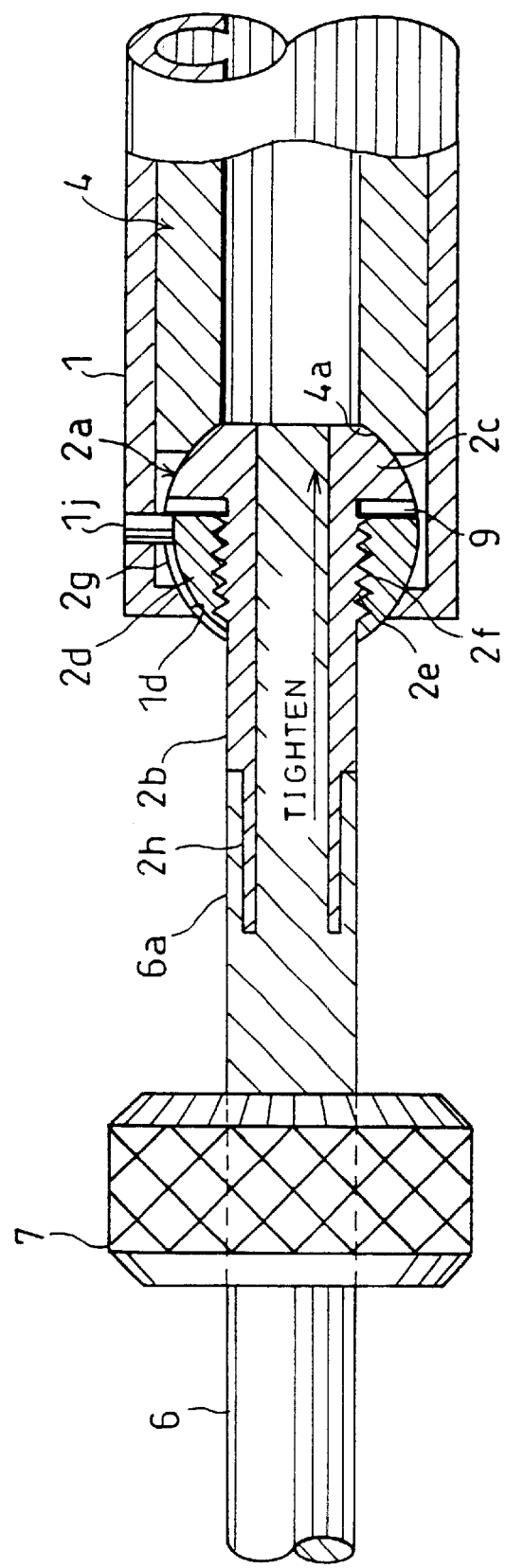
FIG. 1 is a cross sectional view of a main portion of a gas injector in accordance with a First Embodiment of the present invention, showing a state in which a nozzle is fixed after adjusting a gas injection direction of the nozzle.

Then, the nozzle 2b is adjusted by moving it in horizontal and vertical directions so that the tip of the nozzle direction indicator rod 6 points 0 on the direction indicator board 5 (gas injection direction is set in position). While maintaining the state where the tip of the nozzle direction indicator rod 6 is pointing 0 on the direction indicator board 5, the spherical portion 2a is tightened as shown in FIG. 1. The spherical portion 2a is tightened by rotating the nozzle 2b in the peripheral direction by way of a handle section 7 in the form of a circular pillar, which is fastened on the nozzle direction indicator rod 6 and which rotates integrally therewith.

Here, the nozzle nut part 2d fitted to the nozzle 2b cannot rotate because the rotation preventing groove 2g formed on its external surface is engaged with the rotation preventing pin 1j. That is, only the nozzle 2b rotates and consequently the spherical base end portion 2c is moved toward the nozzle adjuster 4. As a result, the spherical portion 2a extends along the longitudinal direction. The spherical portion 2a thus extended in the longitudinal direction is tightened by the restoring force due to elastic deformation of the nozzle case 1 or nozzle adjuster 4.

That is, as the spherical portion 2a extends in the longitudinal direction, the pushing force acting between the opening 1d and opening 4a is increased by the restoring force, thereby fixing the spherical portion 2a with respect to the nozzle case 1 by the pushing force and the spherical portion 2a becomes unrotatable. In effect, fastening and direction adjustment of the nozzle section 2 are completed in the state where the direction or angle of the nozzle 2b is easily maintained after it was adjusted. Note that, in the state where the nozzle section 2 is being fixed with respect to the nozzle case 1, there is a gap 9 between the nozzle nut part 2d and the spherical base end portion 2c.

[Second Embodiment]

The following will describe a Second Embodiment as another embodiment of the present invention with reference with FIG. 2, and FIG. 8 through FIG. 12. Note that, for convenience of explanations, the elements having the same functions as those described in the First Embodiment are given the same reference numerals and explanations thereof are omitted here.

Figure 8:
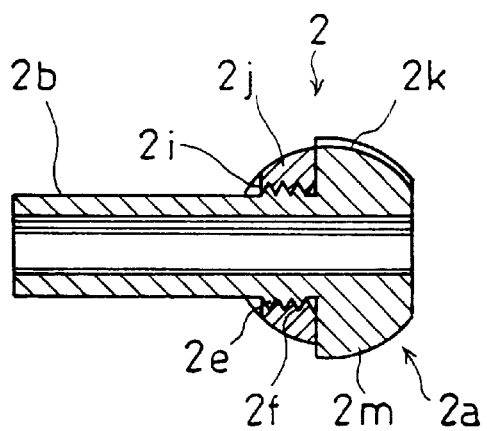
FIG. 8 is a cross sectional view of a nozzle section of a gas injector in accordance with a Second Embodiment.
Figure 9:
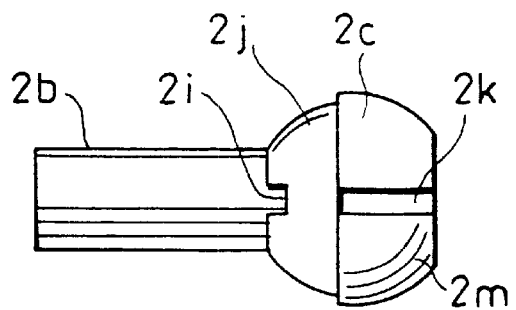
FIG. 9 is a front view of the nozzle section.

As shown in FIG. 8 and FIG. 9, in the Second Embodiment, there is provided a nozzle nut part 2j having rotating notches 2i of a concave shape on its front end surface, instead of the rotation preventing groove 2g of the foregoing nozzle nut 2d. Also, instead of the spherical base end portion 2c, there is provided a spherical base end portion 2m having a rotation preventing groove 2k analogous to the rotation preventing groove 2g.

The following describes how the nozzle section 2 is fastened and adjusted in the foregoing arrangement referring to only those points which are different from the First Embodiment.

Figure 11:
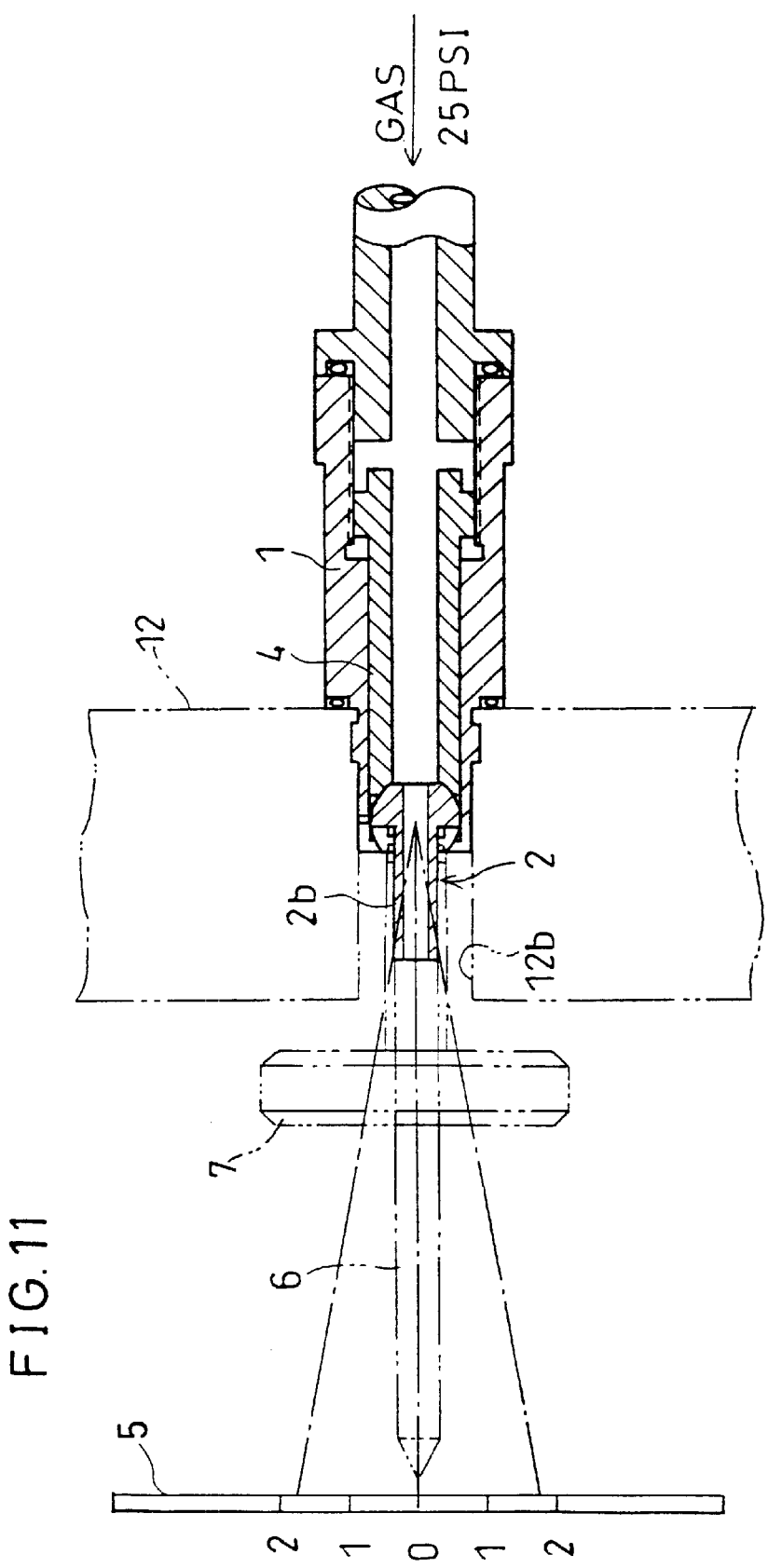
FIG. 11 is a cross sectional view of a main portion of the gas injector, showing how the gas injection direction of the nozzle is adjusted.

First, as shown in FIG. 2, the direction indicator board 5 is fastened on a predetermined position at the upper portion of the quartz bell jar 12 of the semiconductor epitaxial reactor. Then, as shown in FIG. 11, with respect to the nozzle section 2 which was fastened on the nozzle case 1 to be freely rotatable, the base end portion of the nozzle direction indicator rod 6 (FIG. 10(a)) is inserted into the nozzle 2b making up the gas ejection opening of the nozzle section 2. Then, as above, the nozzle 2b is adjusted by moving it in horizontal and vertical directions so that the tip of the direction indicator rod 6 points 0 on the direction indicator board 5.

Figure 10A:
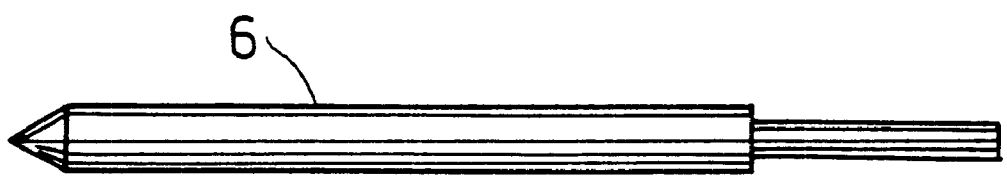
FIG. 10($a$) is a front view of a nozzle direction indicator rod for adjusting the gas injection direction of the nozzle in the gas injector.
Figure 10B:
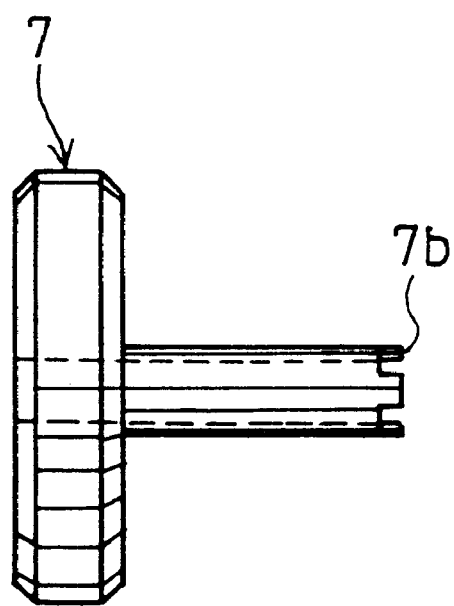

Thereafter, as shown in FIG. 11, the nozzle direction indicator rod 6 is inserted through the handle section 7 (FIG. 10(b)). The handle section 7 has a hollow portion through which the nozzle direction indicator rod 6 is insertable.

Figure 12:
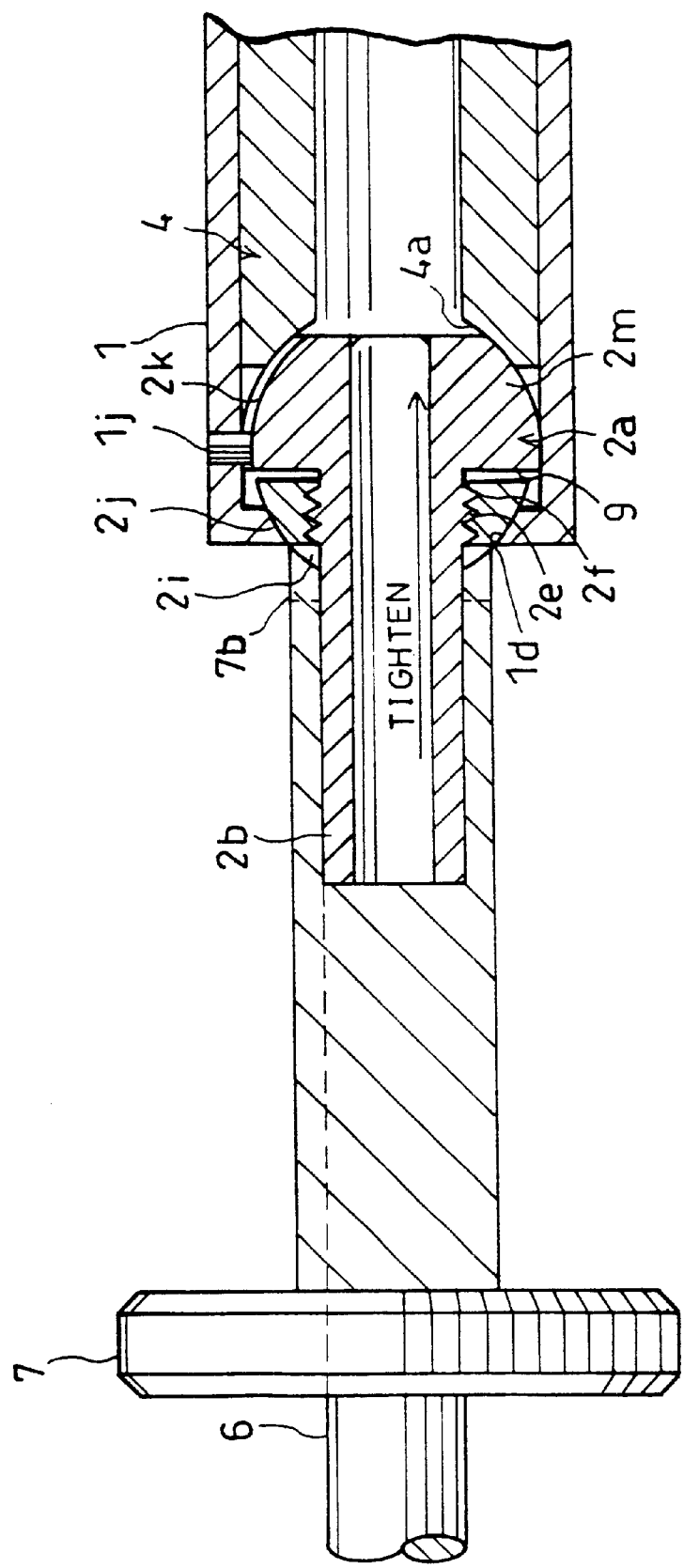
FIG. 12 is a cross sectional view of a main portion of the gas injector, showing a state in which the nozzle is fixed after adjusting the gas injection direction of the nozzle.
Figure 13:
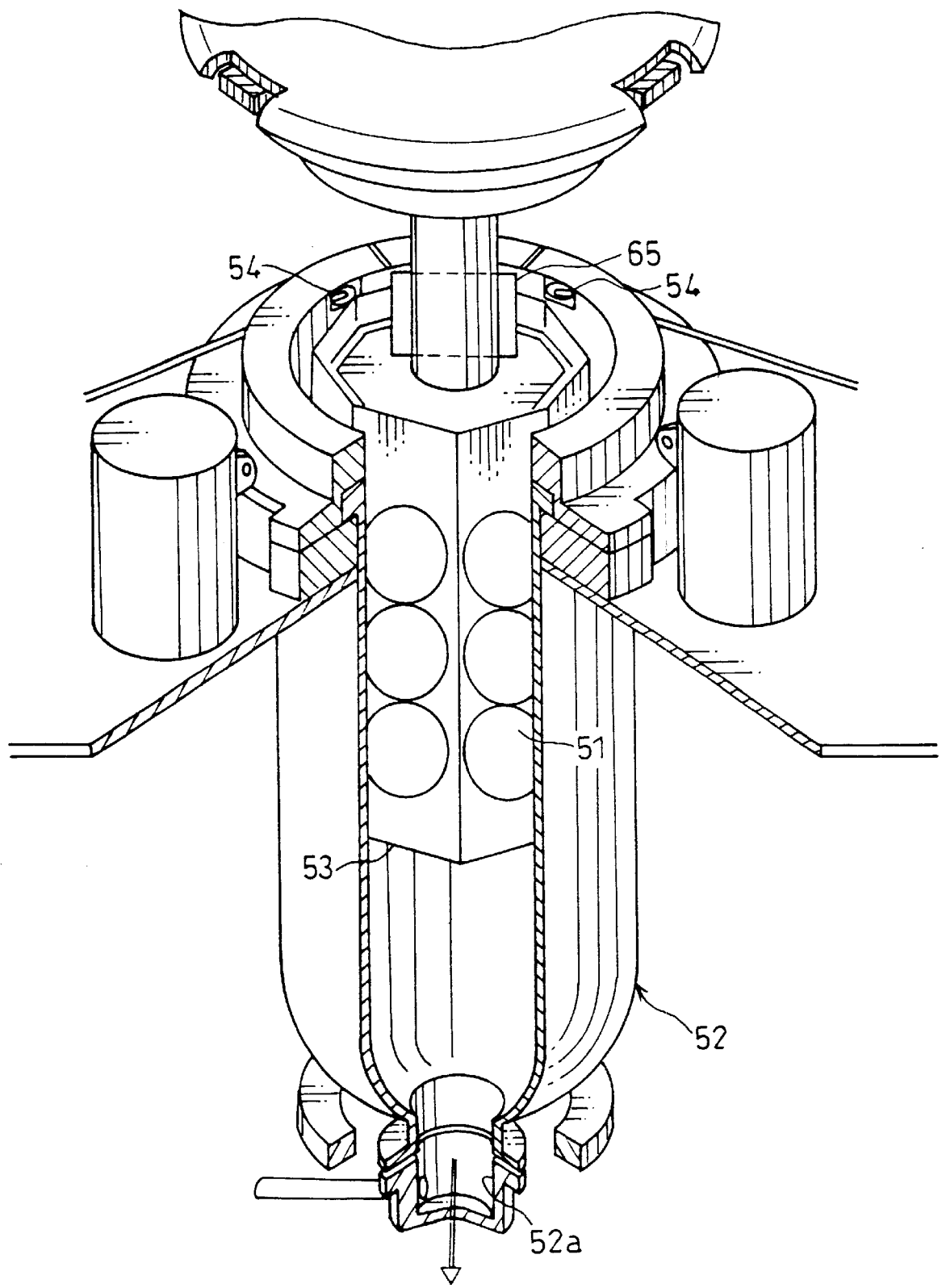
FIG. 13 is a perspective view with a partially broken portion of a semiconductor epitaxial reactor in a conventional gas injector.
Figure 14A:
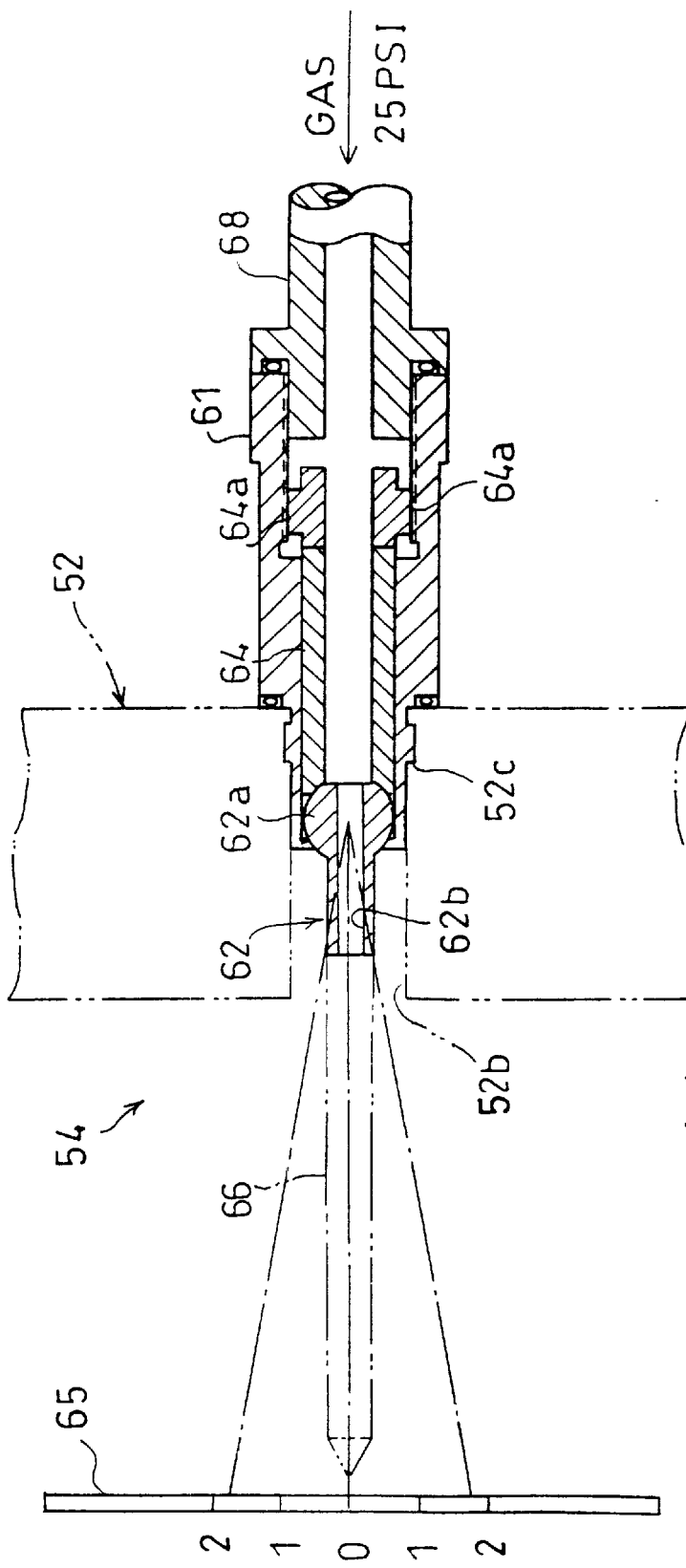
FIG. 14($a$) is a cross sectional view of a main portion of the conventional gas injector, showing how the gas injection direction is adjusted.
Figure 14C:
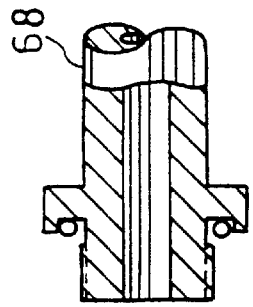
Figure 14B:

Then, as shown in FIG. 11 and FIG. 12, after adjusting the tip of the nozzle direction indicator rod 6 to point 0 on the direction indicator board 5, raised portions 7b of the handle section 7 are engaged with the rotating notches 2i of the nozzle nut part 2j while maintaining the adjusted state.

Then, the spherical portion 2a is tightened by rotating the nozzle nut part 2j by way of the handle section 7. Here, the spherical base end portion 2m of the nozzle section 2 cannot rotate because the rotation preventing groove 2k formed on its external surface is engaged with the rotation preventing pin 1j. Consequently, only the nozzle nut part 2j rotates. Also, the male screw portion 2f formed on the nozzle 2b is fitted to the female screw portion 2e formed on the nozzle nut 2j. As a result, only the spherical base end portion 2m is moved toward the nozzle adjuster 4, thereby tightening the spherical portion 2a.

Thus, the spherical portion 2a is held with a stronger pushing force by the opening 1d and opening 4a, and the nozzle section 2 is fixed and becomes unrotatable with respect to the nozzle case 1. In effect, fastening and direction adjustment of the nozzle section 2 is completed through visual confirmation of the adjusted direction or angle while maintaining the adjusted direction or angle. In the state where the nozzle section 2 is fixed with respect to the nozzle case 1 in this manner, there is a gap 9 between the nozzle nut part 2j and the spherical base end portion 2m.

As described, the gas injector preferably has an arrangement in which the nozzle main body includes first and second members and displacing means for changing relative positions of the first and second members, wherein the first member is the nozzle base end portion and the second member is the nozzle displacing part, and the nozzle base end portion is integral with the nozzle and the nozzle displacing part is moved with respect to the nozzle base end portion along the gas injection direction of the nozzle by rotating one of the nozzle base end portion or nozzle displacing part about the axis of the gas injection direction by the displacing means.

With this arrangement, the gas injection direction of the nozzle can be adjusted by the provision of the nozzle main body supporting section which supports the nozzle main body so as to make the outward gas injection direction of the nozzle adjustable.

Further, with the foregoing arrangement, since one of the nozzle base end portion and the nozzle displacing part is rotated about the axis of the longitudinal direction of the nozzle, the nozzle base end portion and the nozzle displacing part can be separated from one another in the longitudinal direction. That is, the nozzle main body can extend itself in the longitudinal direction to increase the pushing force exerted by the nozzle main body supporting section when supported thereby.

Thus, the nozzle main body can be fixed in the nozzle main body supporting section by the pushing force while maintaining the adjusted direction of the nozzle.

As a result, with the foregoing arrangement, the gas injection direction of the nozzle can be adjusted and fixed by rotating one of the nozzle base end portion and the nozzle displacing part from the side of the nozzle.

Therefore, conventionally required additional operations can be omitted, thus improving productivity.

It is preferable that the nozzle base end portion and the nozzle displacing part each has a screw portion which is fitted to the other so as to be displaceable along the longitudinal direction of the nozzle.

With this arrangement, the foregoing rotation operation is made easier by the screw portions fitted to each other when one of the nozzle and nozzle displacing part is rotated along the longitudinal direction of the nozzle.

In the gas injector, it is preferable that the nozzle base end portion and the nozzle displacing part form a spherical portion which is supported in the nozzle main body supporting section so as to make the gas injection direction adjustable.

With this arrangement, by adjusting the displacement between the nozzle base end portion and the nozzle displacing part, the spherical portion made up of the nozzle base end portion and the nozzle displacing part can be easily rotated while being supported in the nozzle main body supporting section, thereby making it easier to adjust the gas injection direction of the nozzle.

The gas injector may have an arrangement in which one of the nozzle base end portion and the nozzle displacing part has a groove portion for preventing rotation of one following the rotation of the other, and the nozzle main body supporting section has a projectile portion to be engaged with the groove portion.

With this arrangement, by the provision of the groove portion and the projectile portion engaged therewith, relative displacement of the nozzle base end portion and the nozzle displacing part can be stabilized, thus securely adjusting the gas injection direction of the nozzle.

In the gas injector, the groove portion is preferably formed along the longitudinal direction of the nozzle. Also, in the gas injector, the projectile portion is preferably formed so as to extend toward the center of the spherical portion.

With this arrangement, since the groove portion is formed along the longitudinal direction of the nozzle, or the projectile portion is formed to extend toward the center of the spherical portion, it is possible to obtain two rotational axes orthogonal to each other, for example, at the spherical portion, thus increasing the rotation range of the nozzle main body and stabilizing the rotation and therefore securely adjusting the gas injection direction of the nozzle.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A gas injector, comprising:
    a nozzle main body having on its front end portion a nozzle for injecting gas; and
    a nozzle main body supporting section for supporting the nozzle main body, wherein:
        said nozzle main body includes first and second members, and displacing means for changing relative positions of the first and second members with respect to each other, and
        fixed state/unfixed state of the nozzle main body with respect to the nozzle main body supporting section is switched by a change in relative positions of the first and second members by the displacing means, and injection direction of the gas from the nozzle is changed by changing a disposition direction of the nozzle main body in an unfixed state.

2. The gas injector as set forth in claim 1, wherein:
    said first member is a nozzle base end portion, and said second member is a nozzle displacing part, said nozzle base end portion being integral with said nozzle, and
    said displacing means rotates either one of the nozzle base end portion and the nozzle displacing part about an axis of the gas injection direction of the nozzle so as to move the nozzle displacing part with respect to the nozzle base end portion along the gas injection direction of the nozzle.

3. The gas injector as set forth in claim 2, wherein said displacing means is a screw portion which is provided for each of the nozzle base end portion and the nozzle displacing part, the screw portion being fitted with the other so as to be displaceable along the gas injection direction of the nozzle.

4. The gas injector as set forth in claim 2, wherein said displacing means is a cam mechanism for making the nozzle base end portion and the nozzle displacing part displaceable along the gas injection direction of the nozzle.

5. The gas injector as set forth in claim 2, wherein the nozzle base end portion and the nozzle displacing part make up a spherical portion which is supported in the nozzle main body supporting section so as to make the gas injection direction adjustable.

6. The gas injector as set forth in claim 5, wherein at least a portion of the nozzle main body supporting section which is brought into contact with the nozzle main body has a concave shape which is curved along a surface of the spherical portion.

7. The gas injector as set forth in claim 5, wherein:
    one of the nozzle base end portion and the nozzle displacing part includes a groove portion for preventing rotation of one following rotation of the other, and
    the nozzle main body supporting section has a projectile portion to be engaged with the groove portion.

8. The gas injector as set forth in claim 7, wherein the groove portion is formed along the gas injection direction of the nozzle.

9. The gas injector as set forth in claim 7, wherein the projectile portion is provided so as to extend toward a center of the spherical portion.

10. The gas injector as set forth in claim 7, wherein:
    said nozzle includes a rotating notch on its external surface, and
    said groove is formed on the nozzle displacing part, and the nozzle base end portion is rotated using the rotating notch.

11. The gas injector as set forth in claim 7, wherein:
    said nozzle displacing part includes a rotating notch of a concave shape on its front end surface, and
    said groove is formed on the nozzle base end portion, and the nozzle displacing part is rotated using the rotating notch.

12. A gas injection direction adjusting method for a gas injector which includes:
    a nozzle main body having on its front end portion a nozzle for injecting gas; and
    a nozzle main body supporting section for supporting the nozzle main body, wherein:
        said nozzle main body includes first and second members, and displacing means for changing relative positions of the first and second members, and
        fixed state/unfixed state of the nozzle main body with respect to the nozzle main body supporting section is switched by a change in relative positions of the first and second members by the displacing means,
    said method comprising the steps of:
        inserting an adjusting rod from a gas injection opening of the nozzle so as to adjust a gas injection direction of the nozzle by a tip of the adjusting rod; and
        fixing the nozzle main body on the nozzle main body supporting section by changing relative positions of the first and second members.

13. The method as set forth in claim 12, wherein the gas injection direction of the nozzle is adjusted by adjusting the tip of the adjusting rod to point a direction indicator board.

14. The method as set forth in claim 12, the method for use in the gas injector in which:
said first member is a nozzle base end portion, and said second member is a nozzle displacing part, said nozzle base end portion being integral with said nozzle, and
said displacing means rotates either one of the nozzle base end portion and the nozzle displacing part about an axis of the gas injection direction of the nozzle so as to move the nozzle displacing part with respect to the nozzle base end portion along the gas injection direction of the nozzle,
wherein said method rotates one of the nozzle base end portion and the nozzle displacing part by bringing raised portions formed on an inserted portion of the adjusting rod along the insertion direction into contact with a pair of notches formed on the nozzle.

15. The method as set forth in claim 12, wherein the adjusting rod is inserted through a handle section having a hollow portion through which the adjusting rod is insertable, and the handle section is rotated.

16. A gas injector, comprising:
a nozzle main body having on its front end portion a nozzle for injecting gas; and
a nozzle main body storing section for supporting the nozzle main body so as to make an outward gas injection direction of the nozzle adjustable, wherein:
said nozzle main body includes a nozzle base end portion and a nozzle displacing part which is displaceable with respect to the nozzle base end portion along a longitudinal direction of the nozzle,
the nozzle base end portion and the nozzle displacing part are separated from one another by a rotation of one of the nozzle and the nozzle displacing part about an axis of the longitudinal direction;
the nozzle base end portion and the nozzle displacing part make up a spherical portion which is supported in the nozzle main body storing section so as to make the gas injection direction adjustable;
one of the nozzle base end portion and the nozzle displacing part has a groove portion for preventing rotation of one following rotation of the other, and
the nozzle main body storing section has a projectile portion to be engaged with the groove portion.

17. The gas injector as set forth in claim 16, wherein the nozzle base end portion and the nozzle displacing part each has a screw portion which is fitted with the other so as to be displaceable along the longitudinal direction of the nozzle.

18. The gas injector as set forth in claim 16, wherein the nozzle base end portion and the nozzle displacing part make up a spherical portion which is supported in the nozzle main body storing section so as to make the gas injection direction adjustable.

19. The gas injector as set forth in claim 18, wherein:
one of the nozzle base end portion and the nozzle displacing part has a groove portion for preventing rotation of one following rotation of the other, and
the nozzle main body storing section has a projectile portion to be engaged with the groove portion.

20. The gas injector as set forth in claim 16, wherein the groove portion is formed along the longitudinal direction of the nozzle.

21. The gas injector as set forth in claim 16, wherein the projectile portion is formed so as to extend toward a center of the spherical portion.

22. A gas injection direction adjusting method for a gas injector which includes:
a nozzle main body having on its front end portion a nozzle for injecting gas; and
a nozzle main body storing section for supporting the nozzle main body so as to make a gas injection direction from the nozzle adjustable, wherein:
said nozzle main body includes a nozzle base end portion and a nozzle displacing part which is displaceable with respect to the nozzle base end portion along a longitudinal direction of the nozzle, and
the nozzle base end portion and the nozzle displacing part are separated from one another by a rotation of one of the nozzle and the nozzle displacing part about an axis of the longitudinal direction,
said method comprising the steps of:
adjusting the gas injection direction of the nozzle by a tip of an adjusting rod by inserting the adjusting rod from a gas injection opening of the nozzle; and
fixing the nozzle main body on the nozzle main body storing section by separating the nozzle base end portion and the nozzle displacing part from one another by rotating one of the nozzle and the nozzle displacing part while the adjusting rod is being inserted in the nozzle.

23. A gas injector, comprising:
a nozzle main body having on its front end portion a nozzle for injecting gas; and
a nozzle main body supporting section for supporting the nozzle main body;
wherein said nozzle main body includes first and second members, and a screw structure for changing relative positions of the first and second members with respect to each other,
wherein the nozzle main body is in a fixed position with respect to the nozzle main body supporting section when the first and second members are in a first position offset from each other in a longitudinal direction of the nozzle main body, and
wherein the nozzle main body is moveable with respect to the nozzle main body supporting section when the first and second members are in a second position proximate to each other in the longitudinal direction of the nozzle main body.

24. A gas injector, comprising:
a nozzle main body having on its front end portion a nozzle for injecting gas; and
a nozzle main body supporting section for supporting the nozzle main body;
wherein said nozzle main body includes first and second members, and a cam structure for changing relative positions of the first and second members with respect to each other,
wherein the nozzle main body is in a fixed position with respect to the nozzle main body supporting section when the first and second members are in a first position offset from each other in a longitudinal direction of the nozzle main body, and
wherein the nozzle main body is moveable with respect to the nozzle main body supporting section when the first and second members are in a second position proximate to each other in the longitudinal direction of the nozzle main body.

* * * * *